US007821812B2

(12) United States Patent
Kim

(10) Patent No.: US 7,821,812 B2
(45) Date of Patent: Oct. 26, 2010

(54) LOW-POWER DRAM AND METHOD FOR DRIVING THE SAME

(75) Inventor: Yong-Ki Kim, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 410 days.

(21) Appl. No.: 11/976,241

(22) Filed: Oct. 23, 2007

(65) Prior Publication Data

US 2008/0094933 A1    Apr. 24, 2008

(30) Foreign Application Priority Data

Oct. 23, 2006    (KR) .................... 10-2006-0102725

(51) Int. Cl.
    *G11C 11/24*    (2006.01)
(52) U.S. Cl. .............. 365/149; 365/230.08; 365/230.01
(58) Field of Classification Search ............ 365/230.08, 365/230.01, 230.06, 149
    See application file for complete search history.

(56) References Cited

U.S. PATENT DOCUMENTS

| 5,400,275 | A |   | 3/1995 | Abe et al. |   |
|---|---|---|---|---|---|
| 6,230,250 | B1 | * | 5/2001 | Vogley | ................ 711/218 |
| 6,243,320 | B1 | * | 6/2001 | Hamamoto et al. | .... 365/230.08 |
| 2004/0213036 | A1 | * | 10/2004 | Farrell et al. | ................ 365/154 |
| 2006/0067151 | A1 | * | 3/2006 | Miyamoto | .................. 365/222 |

FOREIGN PATENT DOCUMENTS

| KR |   10-0183538 B1 | 12/1998 |
|---|---|---|
| KR | 10-2000-0026252 A | 5/2000 |
| KR |   1020050065269 A | 6/2005 |

OTHER PUBLICATIONS

Korean Office Action, with English Translation, issued in Korean Patent Application No. KR 10-2007-0106069, dated Dec. 3, 2008.
Notice of Allowance issued from Korean Intellectual Property Office on May 30, 2009 with an English Translation.
Office Action from German Patent and Trademark Office on Sep. 4, 2009 with an English Translation.
Dave Bursky, "Synchronous DRAMS Clock At 100 MHZ," Electronic Design, Feb. 18, 1993, pp. 45,46,48 and 49.

* cited by examiner

*Primary Examiner*—Vu A Le
*Assistant Examiner*—Han Yang
(74) *Attorney, Agent, or Firm*—IP & T Law Firm PLC

(57) ABSTRACT

A dynamic random access memory includes: an address latch configured to latch a row address in response to a row address strobe (RAS) signal and latch a column address in response to a column address strobe (CAS) signal; a row decoder configured to decode the row address; an enabler configured to decode a part of most significant bits (MSB) of the column address to locally enable a part of one page area corresponding to the row address; and a column decoder configured to decode the column address.

15 Claims, 6 Drawing Sheets

LOW-POWER DRAM AND METHOD FOR DRIVING THE SAME

CROSS-REFERENCE TO RELATED APPLICATIONS

This application claims priority of Korean patent application number 10-2006-0102725, filed on Oct. 23, 2006, which is incorporated by reference in its entirety.

BACKGROUND OF THE INVENTION

The present subject matter relates to a semiconductor device, and more particularly, to a dynamic random access memory (DRAM) architecture.

A DRAM uses a time multiplexed addressing method. A row address is latched when a row address strobe (RAS) signal is inputted, and a column address is latched when a column address strobe (CAS) signal is inputted. When the RAS signal is inputted, a predetermined memory cell array is selected and a word line driver and a sense amplifier are enabled. When the CAS signal is inputted, a read or write operation is determined. A column address to be accessed is latched and a location of data to be inputted/outputted is finally determined.

Generally, before the CAS signal is inputted, a memory cell array of a DRAM cannot determine a location of a memory cell to be accessed. Further, the DRAM must obey a time difference (tRCD) between the RAS signal and the CAS signal. The time difference (tRCD) is required to ensure a time necessary to enable the word line and the sense amplifier.

In other words, a conventional DRAM has a time difference between a row addressing timing for enabling the memory cell array and a column addressing timing for determining the final location of the memory cell.

Since the conventional DRAM cannot determine the final memory cell array at the row addressing timing, the sense amplifier array of the memory cell array is enabled to serve as a row cache. At this point, the predefined number of the cell arrays is called a page size. The page size is determined by the number of column addresses.

Specifically, memory cell arrays of one page are enabled in response to the RAS signal. Thereafter, a column address is provided for determining a location of data to be finally inputted/outputted in response to the CAS signal.

However, the conventional DRAM has a structural problem in that one page is enabled regardless of the size of data which will be finally inputted/outputted during one access cycle, thus causing an excessive power consumption.

SUMMARY OF THE INVENTION

Embodiments of the present invention are directed to providing a DRAM, which can reduce power consumption caused by memory access, and a method for driving the same.

In accordance with a first aspect of the present invention, there is provided a dynamic random access memory, including: an address latch configured to latch a row address in response to a row address strobe (RAS) signal and latch a column address in response to a column address strobe (CAS) signal; a row decoder configured to decode the row address; an enabler configured to decode a part of most significant bits (MSB) of the column address to locally enable a part of one page area corresponding to the row address; and a column decoder configured to decode the column address.

In accordance with a second aspect of the present invention, there is provided a dynamic random access memory, including: an address latch configured to latch a row address in response to a row address strobe (RAS) signal and latch a column address in response to a column address strobe (CAS) signal; a row decoder configured to decode the row address; an MSB code decoder configured to decode a part of MSB bits of the column address to generate a page area select signal; a row element configured to locally enable a part of one page area corresponding to the row address in response to the page area select signal.

In accordance with a third aspect of the present invention, there is provided a method for driving a dynamic random access memory, including: latching a row address in response to a row address strobe (RAS) signal; decoding the row address; latching a column address in response to a column address strobe (CAS) signal; decoding a part of most significant bits (MSB) of the column address to locally enable a part of one page area corresponding to the row address; and decoding the column address.

In accordance with a fourth aspect of the present invention, there is provided a dynamic random access memory, including: a command input channel configured to receive external commands; an address input channel configured to receive an address signal; a command decoder configured to decode the external commands to generate internal command signals; a controller configured to generate control signals including a row address strobe (RAS) signal and a column address strobe (CAS) signal in response to the internal command signals; an address latch configured to latch row address in response to the row address strobe (RAS) signal and latch column address in response to the column address strobe (CAS) signal; an enabler configured to decode a part of most significant bits (MSB) of the column address to locally enable a part of one page area corresponding to the row address; and a row and a column decoders configured to decode the row address and the column address inputted from the address latch.

DESCRIPTION OF SPECIFIC EMBODIMENTS

Hereinafter, a low-power DRAM and a method for driving the same in accordance with the present invention will be described in detail with reference to the accompanying drawings.

Figure 1:
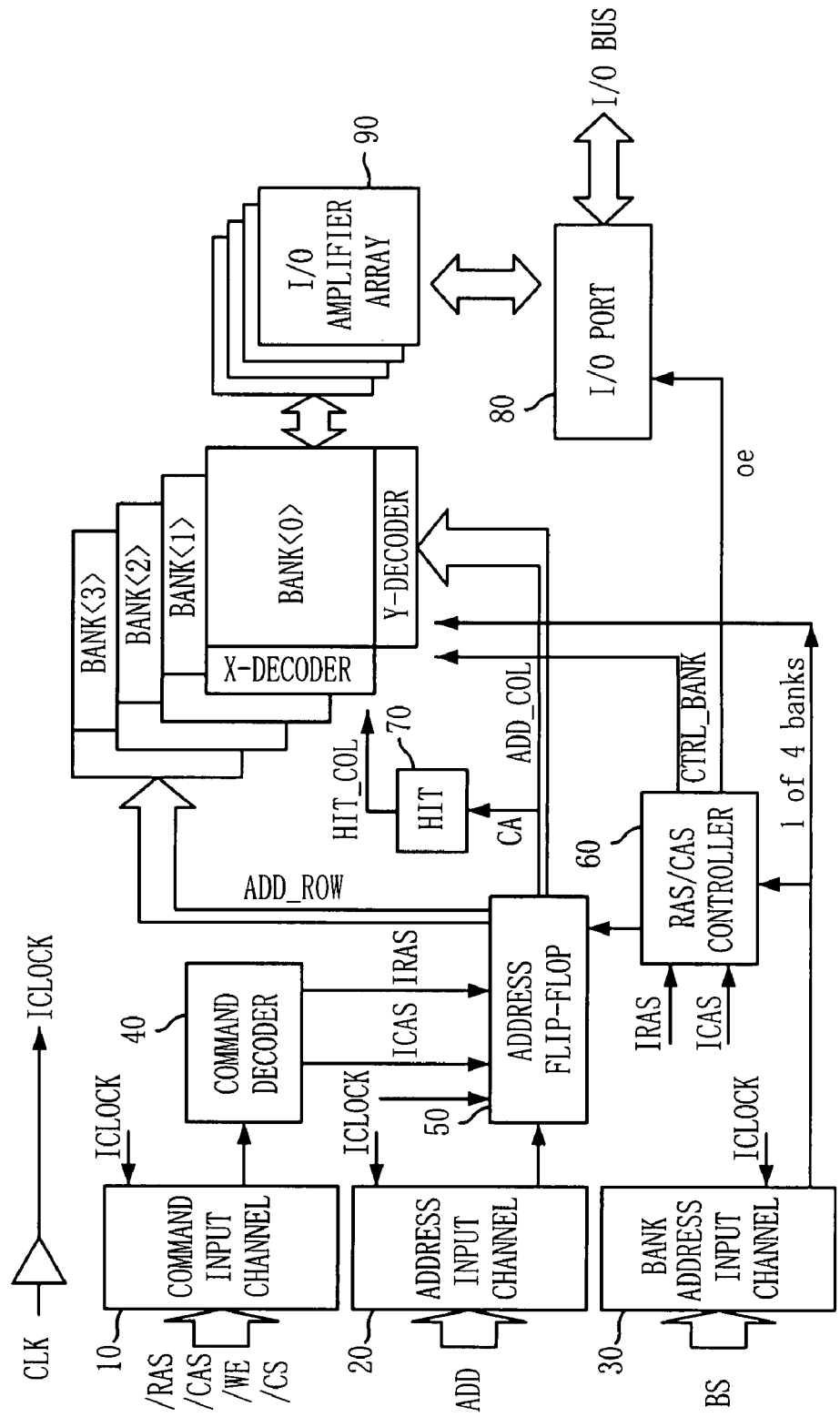
FIG. 1 is a block diagram of a DRAM in accordance with an embodiment of the present invention.

FIG. 1 is a block diagram of a DRAM in accordance with an embodiment of the present invention.

Referring to FIG. 1, the DRAM includes a command input channel 10 configured to receive commands /RAS, /CAS, /WE and /CS for an interface with the outside of the DRAM, an address input channel 20 configured to receive an address signal ADD, a bank address input channel 30 configured to receive a bank address BS, and an input/output (I/O) port 80 configured to input/output data.

Such a DRAM interface operates in synchronization with an internal clock ICLOCK produced by buffering an external clock CLK, and provides address information for enabling the DRAM, designating a location of a memory cell to be accessed, and designating data input/output location while performing data input/output cycles.

The DRAM further includes a command decoder 40, an address flip-flop 50, a RAS/CAS controller 60, and an HIT block 70. The command decoder 40 decodes the commands /RAS, /CAS, /WE and /CS inputted through the command input channel 10 to generate internal command signals, e.g., an internal RAS signal IRAS, an internal CAS signal ICAS, etc. The address flip-flop 50 stores the address signal ADD inputted through the address input channel 20, and selects an address in a RAS cycle or a CAS cycle. The HIT block 70 decodes 2 most significant bit (MSB) bits (CAI, CAJ) of a column address CA to generate a page area select signal HIT_COL. The RAS/CAS controller 60 generates control signals for performing a row cycle or a column cycle and data path in response to the bank address BS, the internal RAS signal IRAS, and the internal CAS signal ICAS. The control signals include a bank control signal CTRL_BANK and an output enable signal OE.

The DRAM also includes a plurality of memory banks BANK<0:3>, and an I/O amplifier array 90 for data exchange between the I/O port 80 and the memory banks BANK<0:3>. Each of the memory banks BANK<0:3> includes an X-decoder for decoding a row address ADD_ROW inputted from the address flip-flop 50, and a Y-decoder for decoding a column address ADD_COL inputted from the address flip-flop 50.

Figure 2:
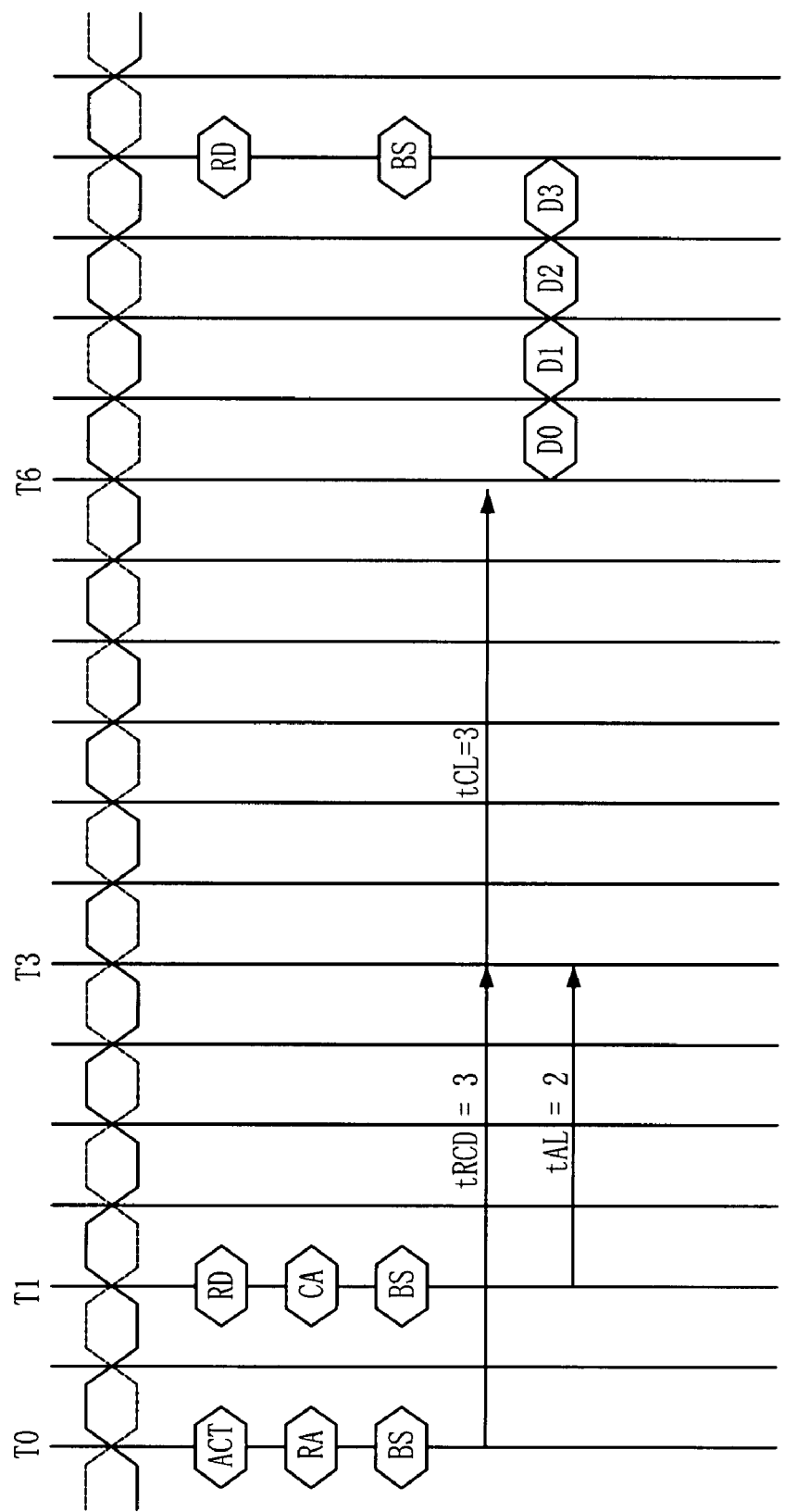
FIG. 2 is a timing diagram of the DRAM illustrated in FIG. 1.

FIG. 2 is a timing diagram of the DRAM illustrated in FIG. 1. An operation of the DRAM will be described below with reference to FIG. 2.

The row address RA and the bank address BS are provided at the same time when an active command ACT is inputted (T0). The row address RA is stored in the address flip-flop 50 and the row decoder decodes the row address RA.

The column address CA is provided at the same time when a read command RD is inputted (T1). The column address CA is stored in the address flip-flop 50. The read command RD is inputted at a next clock after the input of the active command ACT. That is, the CAS signal may be activated at a next clock after the RAS signal is activated. This is possible in a system with an additive latency (AL). A normal RAS to CAS delay time (tRCD) is 3tCK. That is, the CAS signal is activated after 3tCK from the activation of the RAS signal. However, due to the additive latency (AL) (tAL=2), the CAS signal may be fast activated as much. Since the column address CA is previously inputted before the internal column cycle begins, the HIT block 70 can generate the page area select signal HIT_COL by decoding 2 MSB bits of the column address CA. The page area select signal HIT_COL is inputted to the word line driver and the bit line sense amplifier (BLSA) enabler. Therefore, the bit line sense amplifier of the page area where the column access will be performed in the word line selected according to the decoded row address RA is selectively enabled.

Thereafter, the internal column cycle begins at the timing satisfying the RAS to CAS delay time (tRCD) (T3). The column address CA is stored in the address flip-flop 50 and decoded.

Data is outputted after the CAS latency (CL) (tCL=3).

Figure 3A:
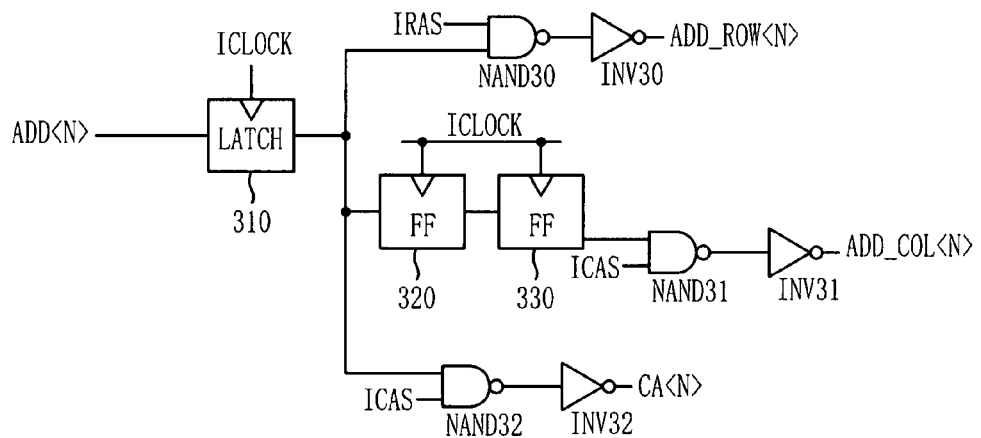
FIG. 3A is a circuit diagram of an address flip-flop illustrated in FIG. 1.

FIG. 3A is a circuit diagram of the address flip-flop 50 illustrated in FIG. 1.

Referring to FIG. 3A, the address flip-flop 50 includes a latch 310, first to third NAND gates NAND30, NAND31, and NAND32, first to third inverters INV30, INV31, and INV32, and first and second D flip-flops 320 and 330. The latch 310 is configured to latch the address signal ADD<N> in response to the internal clock ICLOCK. The first NAND gate NAND30 is configured to receive the address signal outputted from the latch 310 and the internal RAS signal IRAS. The first inverter INV30 is configured to invert an output signal of the first NAND gate NAND30 to output the row address ADD_ROW<N>. The first and second D flip-flops 320 and 330 are configured to delay the address signal outputted from the latch 310 by the additive latency (AL) (tAL=2tCK) in response to the internal clock ICLOCK. The second NAND gate NAND31 is configured to receive an output signal of the second D flip-flop signal 330 and the internal CAS signal ICAS. The second inverter INV31 is configured to invert an output signal of the second NAND gate NAND31 to output the column address ADD_COL<N>. The third NAND gate NAND32 is configured to receive the address signal outputted from the latch 310 and the internal CAS signal ICAS. The third inverter INV32 is configured to invert an output signal of the third NAND gate NAND32 to output the column address MSB signal CA<N>.

The third NAND gate NAND32 and the third inverter INV32 are not necessary to all address bits. Only the address bits corresponding to the MSB code of the column address to be separately decoded are necessary.

Figure 3B:
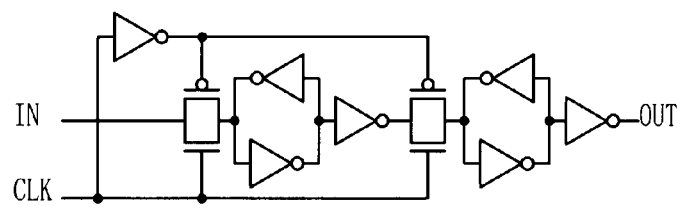
FIG. 3B is a circuit diagram of a first D flip-flop illustrated in FIG. 3A.
Figure 3C:
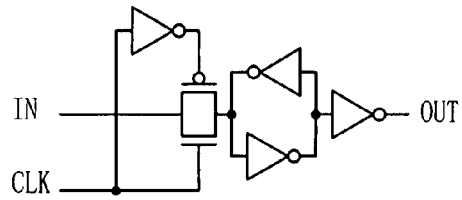
FIG. 3C is a circuit diagram of a latch illustrated in FIG. 3A.

FIG. 3B is a circuit diagram of the first D flip-flop 320 illustrated in FIG. 3A, and FIG. 3C is a circuit diagram of the latch 310 illustrated in FIG. 3A. The second D flip-flop 330 has the same structure as that of the first D flip-flop. Since the configurations of the latch 310 and the D flip-flops 320 and 330 are well known, their detailed description will be omitted.

Figure 4:
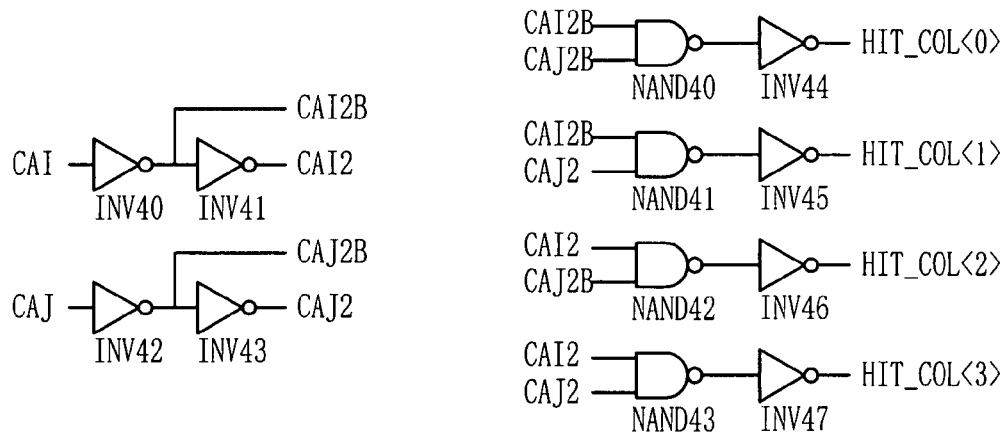
FIG. 4 is a circuit diagram of an HIT block illustrated in FIG. 1.

FIG. 4 is a circuit diagram of the HIT block 70 illustrated in FIG. 1.

Referring to FIG. 4, the HIT block 70 includes first to eighth inverters INV40 to INV47, first to fourth NAND gates NAND40 to NAND43. The first and second inverters INV40 and INV41 are configured to receive the MSB code CAI of the column address to output differential pair signals CAI2B and CAI2. The third and fourth inverters INV42 and INV43 are configured to receive the MSB code CAJ of the column address to output differential pair signals CAJ2B and CAJ2. The first NAND gate NAND40 is configured to receive the differential pair signals CAI2B and CAJ2B. The fifth inverter INV44 is configured to invert an output signal of the first NAND gate NAND40 to output a first page area select signal HIT_COL<0>. The second NAND gate NAND41 is configured to receive the differential pair signals CAI2B and CAJ2. The sixth inverter INV45 is configured to invert an output signal of the second NAND gate NAND41 to output a second page area select signal HIT_COL<1>. The third NAND gate NAND42 is configured to receive the differential pair signals CAI2 and CAJ2B. The seventh inverter INV46 is configured to invert an output signal of the third NAND gate NAND42 to output a third page area select signal HIT_COL<2>. The fourth NAND gate NAND43 is configured to receive the differential pair signals CAI2 and CAJ2. The eighth inverter INV47 is configured to invert an output signal of the fourth NAND gate NAND43 to output a fourth page area select signal HIT_COL<3>.

The HIT block 70 is a decoder for analyzing the MSB codes CAI and CAJ of the column address. The HIT block 70 enables row elements, e.g., the word line driver and/or the BLSA array, only at specific regions designated by the column address. If the row elements are not designated by the page area select signal HIT_COL, they cannot be enabled even though they are included in the same page.

Figure 5:
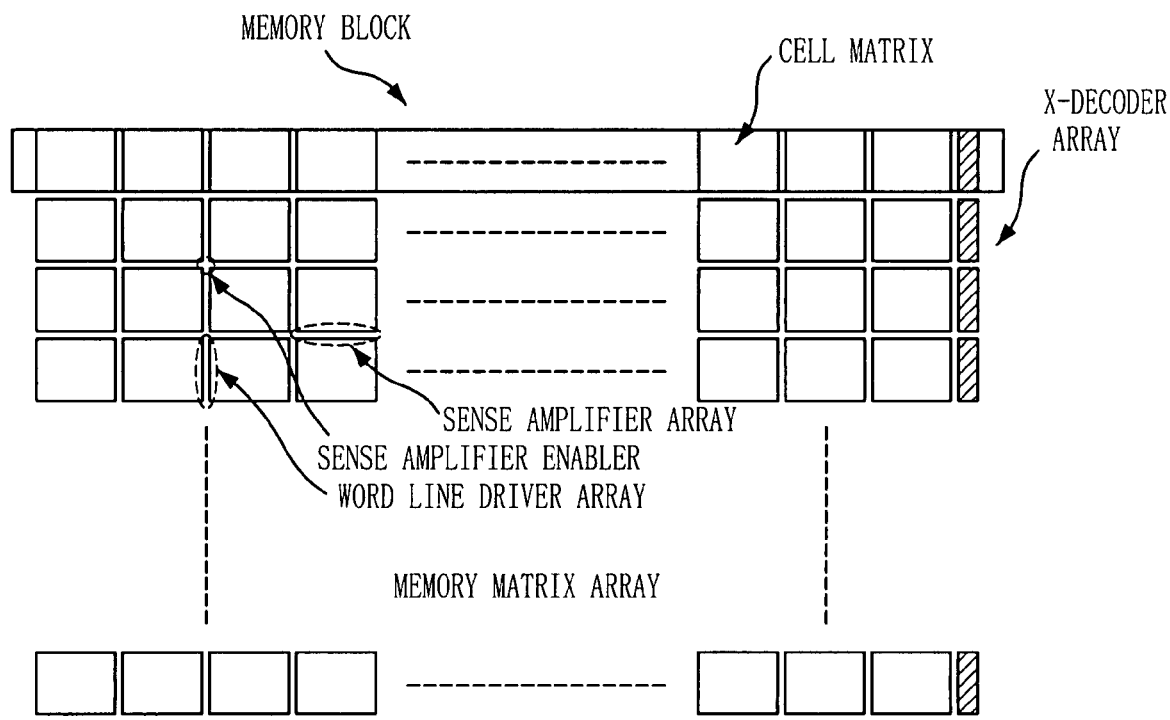
FIG. 5 is a block diagram of a memory bank illustrated in FIG. 1.

FIG. 5 is a block diagram of the memory bank illustrated in FIG. 1.

Referring to FIG. 5, each of the memory banks BANK<0:3> includes a plurality of memory blocks each having a plurality of memory matrixes. The memory matrix is a physical minimum unit constructing a memory cell array.

The memory matrix is connected to a word line driver array and a BLSA array.

A sub hole is defined at an intersection of the word line driver array and the BLSA array. Logics for driving the BLSA array and the word line driver are located at the sub hole. Examples of the logics include a BLSA enabler.

Figure 6:
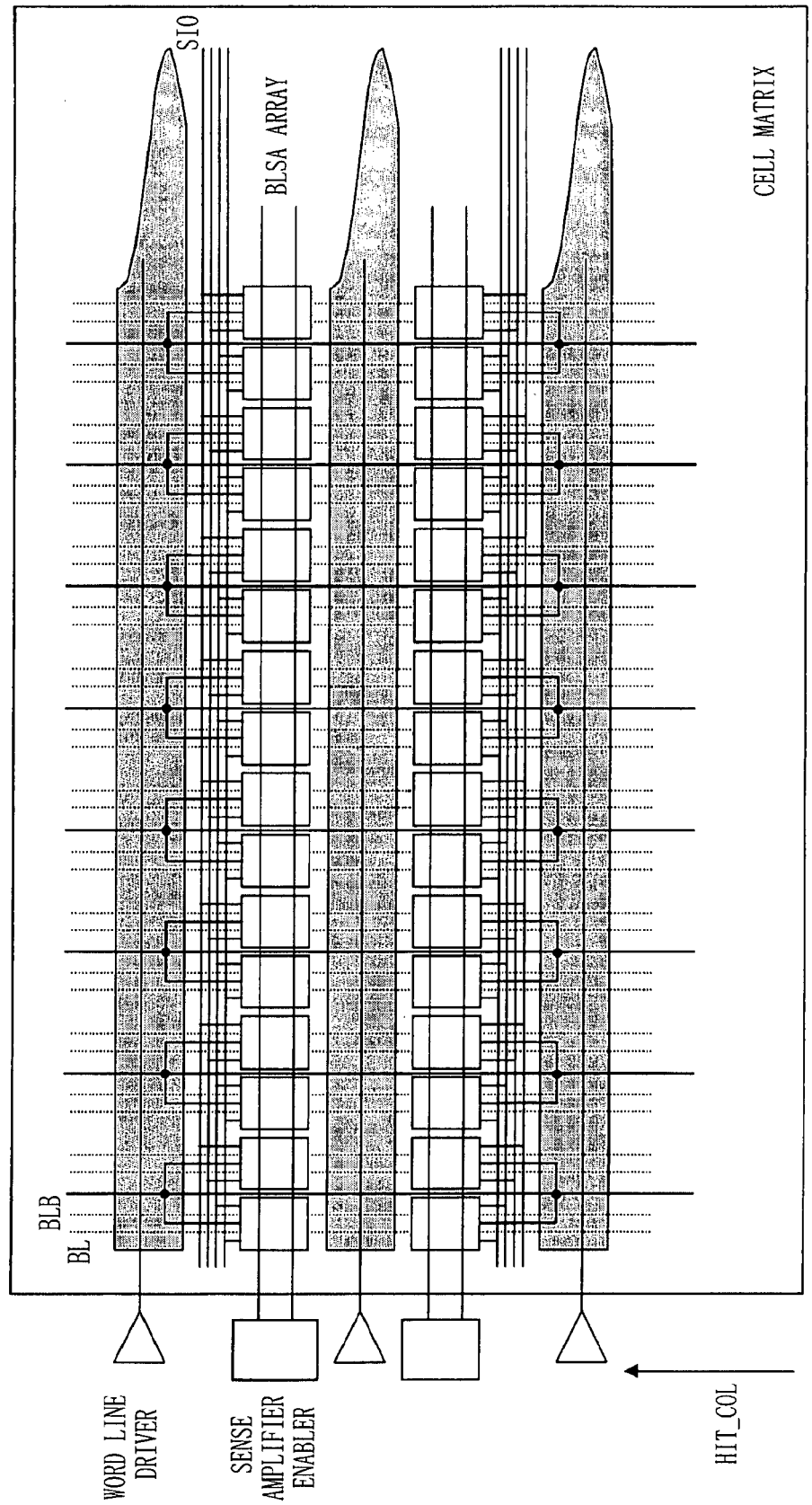
FIG. 6 is a block diagram of a cell matrix and a core driver illustrated in FIG. 5.

FIG. 6 is a block diagram of a cell matrix and a core driver illustrated in FIG. 5.

Referring to FIG. 6, the page area select signal HIT_COL is inputted to the word line driver and the BLSA enabler, and the row element of the cell matrix can be selected according to the row address.

Figure 7:
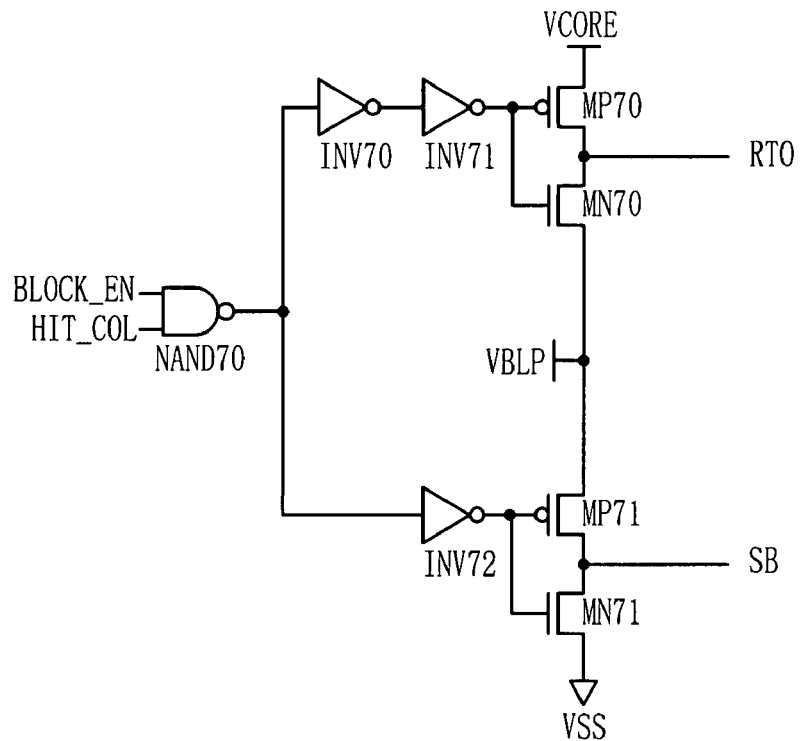
FIG. 7 is a circuit diagram of a BLSA enabler illustrated in FIG. 5.

FIG. 7 is a circuit diagram of the BLSA enabler illustrated in FIG. 5.

Referring to FIG. 7, the BLSA enabler includes a NAND gate NAND70, a first to third inverters INV70, INV71, and INV72, first and second PMOS transistors MP70 and MP71, and first and second NMOS transistors MN70 and MN71. The NAND gate NAND70 is configured to receive a memory block enable signal BLOCK_EN and the page area select signal HIT_COL. The first inverter INV70 is configured to invert an output signal of the NAND gate NAND70. The second inverter INV71 is configured to invert an output signal of the first inverter INV70. The third inverter INV72 is configured to invert the output signal of the NAND gate NAND70. The first PMOS transistor MP70 has a gate receiving the output signal of the second inverter INV71, a source connected to a core voltage terminal VCORE, and a drain connected to a pull-up voltage line RT0 of the bit line sense amplifier. The first NMOS transistor MN70 has a gate receiving the output signal of the second inverter INV71, a source connected to a bit line precharge voltage terminal VBLP, and a drain connected to the pull-up voltage line RT0 of the bit line sense amplifier. The second PMOS transistor MP71 has a gate receiving the output signal of the third inverter INV72, a source connected to the bit line precharge voltage terminal VBLP, and a drain connected to a pull-down voltage line SB of the bit line sense amplifier. The second NMOS transistor MN71 has a gate receiving the output signal of the third inverter INV72, a source connected to a ground voltage terminal VSS, and a drain connected to the pull-down voltage line SB of the bit line sense amplifier.

Figure 8:
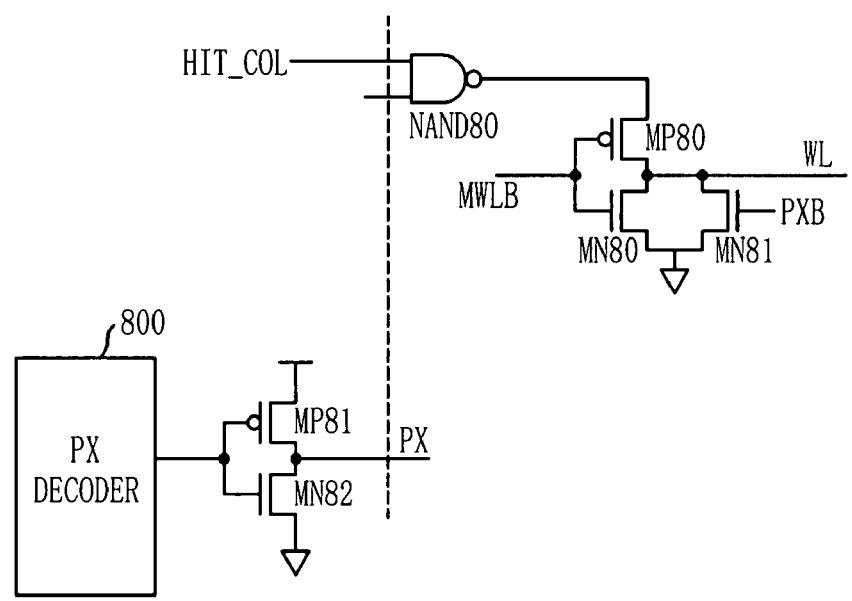
FIG. 8 is a circuit diagram of a word line driver illustrated in FIG. 5.

FIG. 8 is a circuit diagram of the word line driver illustrated in FIG. 5.

Referring to FIG. 8, the word line driver includes a gate stage and a source stage. The gate stage receives an output signal of a primary row decoder included in the memory block, and the source stage receives an output signal of a secondary row decoder included in the memory block. The primary decoder and the secondary decoder may be a row decoder and a PX decoder 800, respectively.

The gate stage of the word line driver includes a NAND gate NAND80, a PMOS transistor MP80, and first and second NMOS transistors MN80 and MN81. The NAND gate NAND80 is configured to receive the page area select signal HIT_COL and an output signal of the row decoder. The first PMOS transistor MP80 has a gate receiving a main word line signal MWLB, a source receiving an output signal of the NAND gate NAND80, and a drain connected to the corresponding sub word line WL. The first NMOS transistor MN80 has a gate receiving the main word line signal MWLB, a source connected to a ground voltage terminal VSS, and a drain connected to the sub word line WL. The second NMOS transistor MN81 has a gate receiving an inverted PX signal PXB, a source connected to the ground voltage terminal VSS, and a drain connected to the sub word line WL.

The source stage of the word line driver includes a CMOS inverter configured to receive an output signal of the PX decoder 800 to output a PX signal PX. The CMOS inverter may be implemented with a PMOS transistor MP81 and an NMOS transistor MN82.

In the DRAM in accordance with the embodiment of the present invention, memory cells of a region determined by the MSB code of the column address are selectively enabled when the active command is inputted, without enabling the entire memory cells (page) connected to the word line determined by the row address. Thus, the power consumption in the memory access can be minimized.

Although the 2 MSB bits have been used as the MSB code of the column address in the above embodiment, the number of MSB bits can be changed.

While the present invention has been described with respect to the specific embodiments, it will be apparent to those skilled in the art that various changes and modifications may be made without departing from the spirit and scope of the invention as defined in the following claims.

What is claimed is:

1. A dynamic random access memory, comprising:
an address latch configured to latch a row address in response to a row address strobe (RAS) signal and latch a column address in response to a column address strobe (CAS) signal;
a row decoder configured to decode the row address;
an enabler configured to decode most significant bits (MSB bits) of the column address to locally enable a part of a page area corresponding to the row address; and
a column decoder configured to decode the column address,
wherein the address latch comprises:
a latch configured to latch an address bit in response to an internal clock;
a first logic unit configured to perform an AND operation on the latched address bit and the RAS signal in outputting the row address;
at least one flip-flop configured to delay the latched address bit by an additive latency; and
a second logic unit configured to perform an AND operation on an output signal of the at least one flip-flop and the CAS signal in outputting the column address.

2. The dynamic random access memory as recited in claim 1, wherein the first and second logic units each include a NAND gate to perform the respective AND operation and invert an output of the AND operation and further includes an inverter configured to invert an output signal of the NAND gate in outputting an address bit.

3. A dynamic random access memory, comprising:
an address latch configured to latch a row address in response to a row address strobe (RAS) signal and latch a column address in response to a column address strobe (CAS) signal;
a row decoder configured to decode the row address;
an MSB code decoder configured to decode MSB bits of the column address to generate a page area select signal; and
a row element configured to locally enable a part of a page area corresponding to the row address in response to the page area select signal,
wherein the address latch comprises:
a latch configured to latch an address bit in response to an internal clock;
a first logic unit configured to perform an AND operation on the latched address bit and the RAS signal in outputting the row address;
at least one flip-flop configured to delay the latched address bit by an additive latency; and
a second logic unit configured to perform an AND operation on an output signal of the at least one flip-flop and the CAS signal in outputting the column address.

4. The dynamic random access memory as recited in claim 3, wherein the first and second logic units each include a NAND gate to perform the respective AND operation and invert an output of the AND operation and further includes an inverter configured to invert an output signal of the NAND gate in outputting an address bit.

5. The dynamic random access memory as recited in claim 3, wherein the address latch further comprises:
third logic unit configured to perform an AND operation on the latched address bit and the CAS signal in outputting an MSB code bit.

6. The dynamic random access memory as recited in claim 3, wherein the address latch further comprises:
a third NAND gate configured to receive the latched address bit and the CAS signal; and
a third inverter configured to invert an output signal of the third NAND gate to output an MSB code bit.

7. The dynamic random access memory as recited in claim 3, wherein the MSB code decoder decodes at least 2 MSB bits of the column address.

8. The dynamic random access memory as recited in claim 3, wherein the row element comprises a word line driver and a bit line sense amplifier enabler.

9. The dynamic random access memory as recited in claim 8, wherein the bit line sense amplifier enabler is configured to control a pull-up voltage line and a pull-down voltage line of a bit line sense amplifier in response to a memory block enable signal and the page area select signal.

10. The dynamic random access memory as recited in claim 8, wherein the word line driver is configured to drives a corresponding sub word line in response to an output signal of the row decoder and the page area select signal.

11. A method for driving a dynamic random access memory, comprising:
latching an address bit in response to an internal clock;
performing an AND operation on the latched address bit and a row address strobe (RAS) signal in outputting a row address;
decoding the row address;
delaying the latched address bit by an additive latency; and
performing an AND operation on the delayed address bit and a column address strobe (CAS) signal in outputting the column address;
decoding of most significant bits (MSB bits) of the column address to locally enable a part of a page area corresponding to the row address; and
decoding the column address.

12. The method as recited in claim 11, wherein the decoding of MSB bits of the column address includes decoding at least 2 MSB bits of the column address.

13. The method of claim 11, wherein the delay time from an activation of the RAS signal to an activation of the CAS signal is smaller than the normal delay time by an additive delay.

14. A dynamic random access memory, comprising:
a command input channel configured to receive external commands;
an address input channel configured to receive an address signal;
a command decoder configured to decode the external commands to generate internal command signals;
a controller configured to generate control signals including a row address strobe (RAS) signal and a column address strobe (CAS) signal in response to the internal command signals;
an address latch configured to latch a row address in response to the row address strobe (RAS) signal and latch a column address in response to the column address strobe (CAS) signal;
an enabler configured to decode a part of most significant bits (MSB bits) of the column address to locally enable a part of ene-a page area corresponding to the row address; and
a row and a column decoders configured to decode the row address and the column address inputted from the address latch,
wherein the address latch comprises:
a latch configured to latch an address bit in response to an internal clock;
a first logic unit configured to perform an AND operation on the latched address bit and the RAS signal in outputting the row address;
at least one flip-flop configured to delay the latched address bit by an additive latency; and
a second logic unit configured to perform an AND operation on an output signal of the at least one flip-flop and the CAS signal in outputting the column address.

15. The dynamic random access memory of claim 14, further comprising:
a plurality of memory banks each of which includes the row decoder and the column decoder;
an input/output port configured to input/output data from the plurality of memory banks; and
an input/output amplifier array for data exchange between the input/output port and the plurality of memory banks.

* * * * *